United States Patent
Kneissl et al.

(10) Patent No.: US 7,123,637 B2
(45) Date of Patent: Oct. 17, 2006

(54) NITRIDE-BASED LASER DIODE WITH GAN WAVEGUIDE/CLADDING LAYER

(75) Inventors: Michael A. Kneissl, Mountain View, CA (US); David P. Bour, Cupertino, CA (US); Linda T. Romano, Sunnyvale, CA (US); Christian G. Van de Walle, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 216 days.

(21) Appl. No.: 10/394,559

(22) Filed: Mar. 20, 2003

(65) Prior Publication Data

US 2004/0184496 A1    Sep. 23, 2004

(51) Int. Cl.
*H01S 5/00* (2006.01)

(52) U.S. Cl. .................... 372/43.01; 257/96
(58) Field of Classification Search ........... 372/43.01, 372/45.01, 46.01, 75
See application file for complete search history.

(56) References Cited

U.S. PATENT DOCUMENTS

| | | | | |
|---|---|---|---|---|
| 5,493,577 A | * | 2/1996 | Choquette et al. ..... | 372/46.013 |
| 5,834,331 A | * | 11/1998 | Razeghi ............... | 438/40 |
| 5,932,896 A | * | 8/1999 | Sugiura et al. ........ | 257/94 |
| 6,121,638 A | * | 9/2000 | Rennie et al. ......... | 257/103 |
| 6,459,100 B1 | * | 10/2002 | Doverspike et al. .... | 257/97 |
| 6,522,676 B1 | * | 2/2003 | Goto et al. ........... | 372/43.01 |
| 6,618,413 B1 | * | 9/2003 | Bour et al. ........... | 372/45.01 |
| 6,661,822 B1 | * | 12/2003 | Kubota et al. ........ | 372/46.01 |

* cited by examiner

*Primary Examiner*—Harvey Minsun
*Assistant Examiner*—Tuan N. Nguyen
(74) *Attorney, Agent, or Firm*—Bever, Hoffman & Harms, LLP; Patrick T. Bever

(57) ABSTRACT

A nitride-based laser diode structure utilizing a single GaN:Mg waveguide/cladding layer, in place of separate GaN:Mg waveguide and AlGaN:Mg cladding layers used in conventional nitride-based laser diode structures. When formed using an optimal thickness, the GaN:Mg layer produces an optical confinement that is comparable to or better than conventional structures. A thin AlGaN tunnel barrier layer is provided between the multiple quantum well and a lower portion of the GaN:Mg waveguide layer, which suppresses electron leakage without any significant decrease in optical confinement. A split-metal electrode is formed on the GaN:Mg upper waveguide structure to avoid absorption losses in the upper electrode metal. A pair of AlGaN:Si current blocking layer sections are located below the split-metal electrode sections, and separated by a gap located over the active region of the multiple quantum well.

21 Claims, 4 Drawing Sheets

NITRIDE-BASED LASER DIODE WITH GAN WAVEGUIDE/CLADDING LAYER

FIELD OF THE INVENTION

This invention relates to laser diodes, and more particularly to nitride-based laser diode structures.

BACKGROUND OF THE INVENTION

Laser diodes are used in many laser applications, such as in laser printing, optical data storage, long-haul fiber communication, spectroscopy, metrology, barcode scanners, and fiber amplifier pump sources. Laser diode structures generally include a central waveguide/quantum well "active" region flanked by upper and lower cladding layers. This configuration is also known as separate confinement heterostructure (SCH). Because of its high refractive index, light is confined to this active region "core" of the structure, where optical gain is produced. The upper and lower cladding layers are formed from material having a lower refractive index than the core, and serve to contain the optical mode. This arrangement guides the optical mode along the active region core, creating a laser light beam that is emitted from a face of the structure.

FIG. 7 is a simplified perspective view depicting a conventional Indium-Gallium-Nitride (InGaN) multi-quantum-well (MQW) laser diode 50, which is exemplary of the type of nitride-based laser diode specifically addressed by the present invention. Referring to the lower portion of FIG. 7, laser diode 50 includes an n-doped layer 62 (e.g., Silicon-doped Gallium-Nitride (GaN:Si)) formed on a substrate 60 (e.g., Sapphire ($Al_2O_3$), Silicon-Carbide (SiC), Aluminum-Nitride (AlN), or Gallium-Nitride (GaN)). An n-electrode 64 (e.g., a Titanium-Aluminum (Ti/Al) or Titanium-Gold (Ti/Au) bilayer) and an n-doped cladding layer 66 (e.g., Si-doped Aluminum-Gallium-Nitride (AlGaN:Si)) are formed on n-doped layer 62. A stack is formed on n-doped cladding layer 66 that includes an n-doped waveguide layer 68 (e.g., GaN:Si), a multiple quantum well (MQW) region 70 including multiple (e.g., three) InGaN quantum wells separated by GaN barrier layers, a p-doped waveguide layer 74 (e.g., GaN:Mg), a p-doped cladding layer 76 (e.g., AlGaN:Mg), a second p-doped contact layer 78 (e.g., GaN:Mg), and a p-electrode 80 (e.g., a Ni/Au bilayer).

During the operation of InGaN MQW laser diode 50, a suitable voltage potential is applied to n-electrode 64 and p-electrode 80. The respective n-type and p-type materials inject electrons and holes from these electrodes to the p-n junction provided by MQW region 70, which produces a highly coherent (in this case blue) laser beam LB that is emitted from an area 51 located on a face of laser diode 50. In general, the purpose of the waveguide and cladding layers is to confine the optical mode to a central (core) region of MQW region 70 associated with area 51. This is achieved by forming waveguide layers 68 and 74 from materials having relatively high refractive indexes (although lower than that of MQW region 70), and cladding layers 66 and 76 from materials having relatively low refractive indexes. For several reasons, cladding layers 66 and 76 are formed by adding Al to the material used to form waveguide layers 68 and 74, along with an appropriate dopant (e.g., Si or Mg).

It is critical that laser diodes be precisely formed and made from materials of excellent structural and optoelectronic quality in order to optimize the emitted laser beam. Structural defects (such as dislocations or cracks) or impurities can seriously degrade the luminescence efficiency of the semiconductor materials. In addition, the thickness and shape of the various layers are important to optimize the emitted laser beam.

A problem associated with the use of AlGaN:Mg to produce upper cladding layer 76 of InGaN laser diode 50 (FIG. 7) is that both the thickness and Al concentration are limited by cracking, which then limits the refractive index difference between upper cladding layer 76 and waveguide layer 74 and the active region formed by MQW region 70, and consequently limits the resulting optical confinement. In addition, it is difficult to achieve a high hole concentration in AlGaN alloys because the ionization energy of Mg acceptors increases with increasing Al content. Therefore, Mg doped AlGaN cladding layers increase the series resistance, and ultimately produce undesirable heating of InGaN laser diode 50 during operation. Furthermore, reliable control of the lateral optical mode has proven to be difficult in conventional InGaN laser devices, where typically a ridge-waveguide structure is employed for lateral confinement of the optical mode. A lateral index step is achieved by dry-etching upper AlGaN:Mg cladding layer 76. Because there is no reliable selective etch process known for AlGaN, the etch depth and the resulting index step are difficult to control.

FIGS. 8(A) and 8(B) are graphs depicting modeling data associated with conventional nitride laser diode structure 50 having a ten-InGaN/GaN MQW region 70 and an upper cladding layer 76 comprising $Al_{0.08}Ga_{0.92}N$:Mg. FIG. 8(A) is a graph showing calculated confinement factors Γ depending on the AlGaN:Mg cladding layer thickness, and indicates a confinement factor Γ of the optical mode is expected to be around 0.08. FIG. 8(B) is a graph showing calculated metal absorption loss for a conventional 10 InGaN/GaN-MQW laser diode structure for different top p-electrode metal layers as a variation of the AlGaN:Mg cladding layer thickness. As indicated, the absorption loss from the top p-metal layer in such a structure depends greatly on the thickness of the AlGaN:Mg cladding layer. In order to achieve reasonable low loss values (~1 $cm^{-1}$), a cladding layer thickness in the range of 400–500 nm is necessary. Further, these loss values are only a lower estimate, not taking into account the losses due to surface roughness (e.g., induced by the metal alloy fabrication process) or metal penetrating into the (Al)GaN layers. Therefore, in order to improve the optical confinement and reduce absorption loss, the AlGaN:Mg layer ideally should be kept as thick as possible. However, as set forth above, AlGaN:Mg contributes significantly to the series resistance of the device, and also has to be kept thin enough in order to avoid cracking, which degrades the optoelectronic quality of the laser diode. An AlGaN:Mg free device structure would therefore be beneficial in order to overcome these two problems.

What is needed is an index guided single-mode laser diode structure that does not include a p-AlGaN cladding layer, while still maintaining the same optical confinement factor and avoiding significant absorption loss in the p-metal. In addition, the series resistance in the laser diode should be largely reduced.

SUMMARY OF THE INVENTION

The present invention is directed to a nitride-based laser diode structure that utilizes a single p-GaN layer in place of the separate waveguide and cladding layers found in conventional structures, thereby eliminating the need for a p-AlGaN cladding layer and thus reducing the series resistance of the laser diode structure.

In accordance with a specific embodiment of the present invention, an AlGaN-based laser diode structure includes an n-type lower cladding layer (e.g., AlGaN:Si), an n-type lower waveguide layer (e.g., GaN:Si) formed on the lower cladding layer, an InGaN-based multiple quantum well (InGaN-MQW) region formed on the lower waveguide layer, a GaN:Mg upper waveguide/cladding layer formed over the InGaN-MQW, and a metal p-electrode structure (e.g., Ti/Au, Pt/Pd/Au, or Pd/Au) formed on the upper waveguide/cladding layer.

According to a first aspect of the present invention, the GaN:Mg upper waveguide/cladding layer of the specific embodiment has a thickness in the range of 50 nm to 1000 nm, preferably approximately 200 nm. By forming the GaN:Mg upper waveguide/cladding layer in this thickness range, simulated laser diode structures were determined to provide an optical confinement that is comparable to conventional laser diode structures using separate p-GaN waveguide and p-AlGaN cladding layers.

According to a second aspect of the present invention, a thin (i.e., less than or equal to approximately 20 nm) p-AlGaN tunnel barrier layer is formed between the quantum well active region and the GaN:Mg upper waveguide/cladding layer. The amount of Aluminum incorporated into the AlGaN barrier layer is in the range of 10 to 30% (mole fraction). Device simulations performed by the inventors indicated that the electron leakage can be minimized by incorporating such a barrier layer into the laser diode structure.

According to a third aspect of the present invention, the p-electrode metal structure formed on the GaN:Mg upper waveguide/cladding layer is formed in a split-metal arrangement for avoiding absorption losses of the transverse optical mode from metal located directly on the waveguide/cladding layer over the MQW active region. The split-gate arrangement includes spaced-apart first and second flat portions that are formed on the upper surface of the upper waveguide/cladding layer. With this arrangement, a central portion of the upper waveguide/cladding layer that is located over the MQW active region does not have metal formed thereon. In one embodiment, a bridge structure is connected between the first and second flat portions and extends over an upper surface of the upper waveguide/cladding layer such that a (e.g., air-filled) gap region is formed between the upper surface portion of the central waveguide/cladding section and a lower surface of the bridge portion. In an alternative embodiment, this gap region is filled with a suitable dielectric (e.g., $SiO_2$, $Si_3N_4$, $Si_xO_yN_z$, and polyimid).

In yet another alternative embodiment, a current blocking layer is provided inside the upper waveguide/cladding layer to direct current into the MQW active region from the split-gate p-electrode structure. The current blocking structure includes first and second portions respectively located below the first and second flat portions of the metal electrode structure and separated by the central section of the waveguide/cladding layer. The current blocking layer is formed using at least one of AlGaN:Si, AlN:Mg, AlN:Si, $SiO_2$, GaN:Si, $Si_3N_4$, and $Si_xO_yN_z$.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention is described below with particular reference to InGaN-based laser diode structures. While the present invention is particularly useful in conjunction with InGaN-based laser diode structures, aspects of the present invention may be utilized in other nitride-based laser diode structures as well. Therefore, it is understood that the scope of the present invention is limited by the appended claims, and not necessarily by the specific embodiments described herein.

Figure 1:
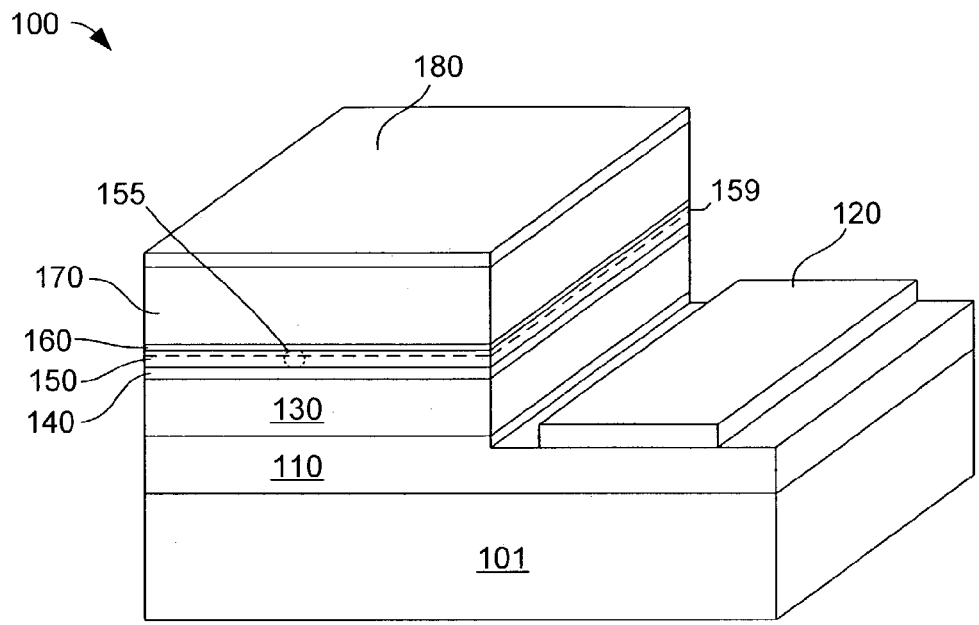
FIG. 1 is a perspective view showing a nitride-based laser diode structure according to a first embodiment of the present invention.

FIG. 1 is a front elevation view showing a nitride-based laser device structure 100 according to an embodiment of the present invention. Laser device structure 100 is formed on a substrate 101 (e.g., Sapphire ($Al_2O_3$), silicon carbide (SiC), GaN, or AcN), and includes a n-type contact layer 110 (e.g., GaN:Si or AlGaN:Si) formed on substrate 101. An n-electrode 120 (e.g., Ti/Au, Ti/Al, Ti/Al/Au or Ti/Al/Mo/Au) is formed on a first (exposed) region of n-type contact layer 110, and an n-type lower cladding layer 130 (e.g., AlGaN:Si or InAlGaN:Si) is formed on a second region of N-type contact layer 110. An n-type lower waveguide layer 140 (e.g., GaN:Si, InGaN:Si or InAlGaN:Si) is formed on lower cladding layer 130. Note that the bandgap energy of lower waveguide layer 140 is less than that of lower cladding layer 130, and the refractive index of lower waveguide layer 140 is greater than that of lower cladding layer 130. A multiple quantum well (MQW) region 150 (e.g., ten InGaN layers sandwiched between corresponding GaN barrier layers), which has a central active region 155, is formed-on lower waveguide layer 140. An optional p-type barrier layer 160 (e.g., AlGaN:Mg) is formed on MQW region 150. A combination upper (p-type) waveguide/cladding layer 170 is formed on barrier layer 160. Finally, a metal electrode (p-electrode) 180 (e.g., Ni/Au, Pd/Pt/Au, Pd/Au or Pd/Ti/Au) is formed on upper waveguide/cladding layer 170. The various structures/layers of laser device structure 100 that are shown in FIG. 1 and mentioned above are formed using metal organic chemical vapor deposition (MOCVD), which is a well known deposition technique (see, for example, "Organometallic Vapor-Phase Epitaxy: Theory and Practice", G. B. Stringfellow, Academic Press, 1989).

According to the present invention, upper waveguide/cladding layer 170 is formed using GaN doped with a suitable p-type dopant (e.g., Mg), and is formed to a thickness that obviates the need for separate GaN:Mg-based waveguide and AlGaN:Mg-based cladding layers, as used in conventional nitride-based laser diode structures. That is, the GaN:Mg of upper waveguide/cladding layer 170 extends substantially from the upper edge of MQW region 150 (i.e., with optional tunnel barrier layer 160 formed therebetween, as discussed below) to metal electrode 180, without an intervening AlGaN:Mg cladding layer. Eliminating AlGaN:Mg cladding from nitride-based laser device structure 100 provides several advantages. First, eliminating the AlGaN:Mg cladding facilitates reduced series resistance because relatively high amounts of Mg doping can be added to the GaN material without detrimental effects. In addition, eliminating AlGaN:Mg cladding facilitates better control over the lateral index step and lateral mode profile because there is no reliable selective etch process known for AlGaN and GaN (i.e., both materials are equally etched by the dry etching process typically utilized to form the lateral index step), so the etch depth and the resulting index step are difficult to control in structures including both GaN-based waveguide and AlGaN cladding layers.

Figure 2:
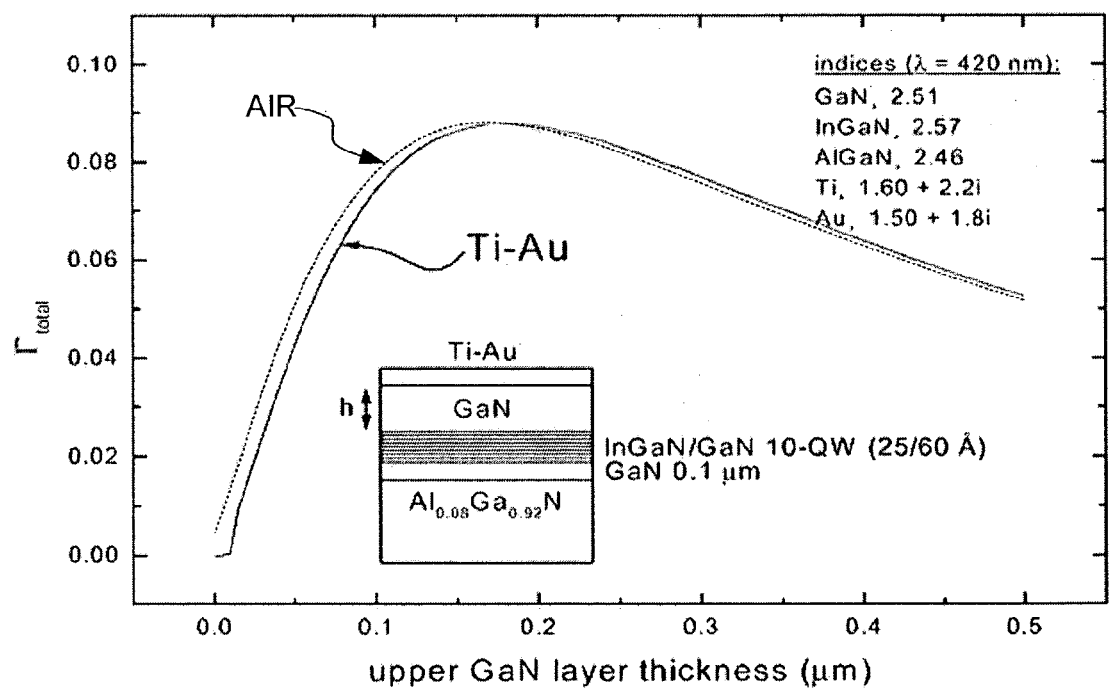
FIG. 2 is a graph showing variations in the optical confinement factor for the laser diode structure of FIG. 1.
Figure 7:
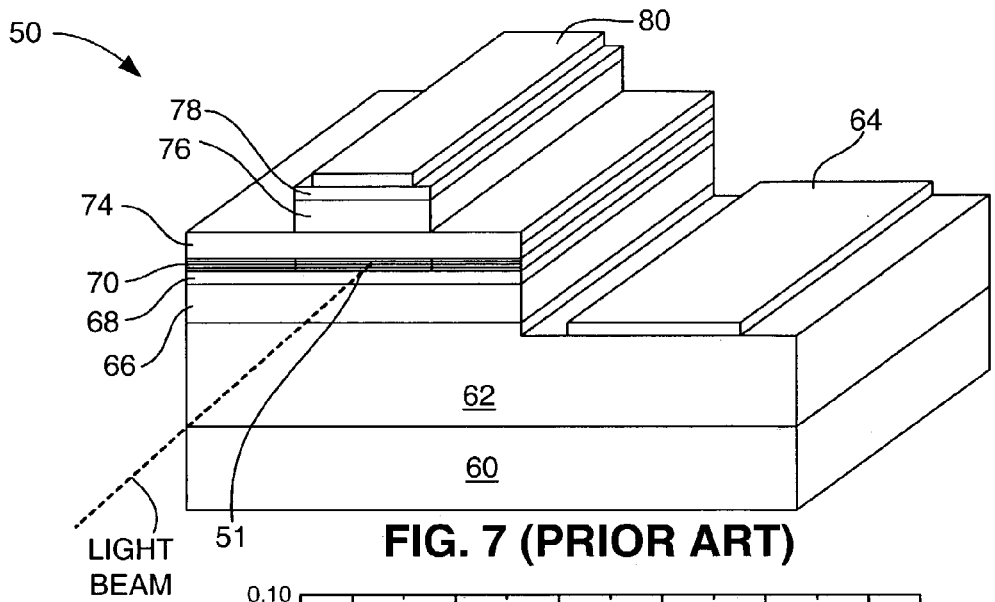
FIG. 7 is a perspective view showing a conventional InGaN-based laser diode structure.
Figure 8A:
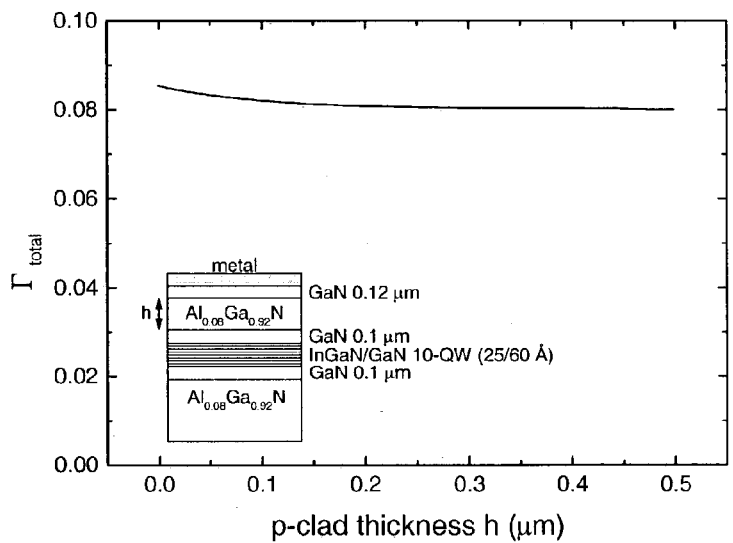
FIGS. 8(A) and 8(B) are graphs showing calculated confinement factors and metal absorption losses for a conventional InGaN-based laser diode structure.
Figure 8B:
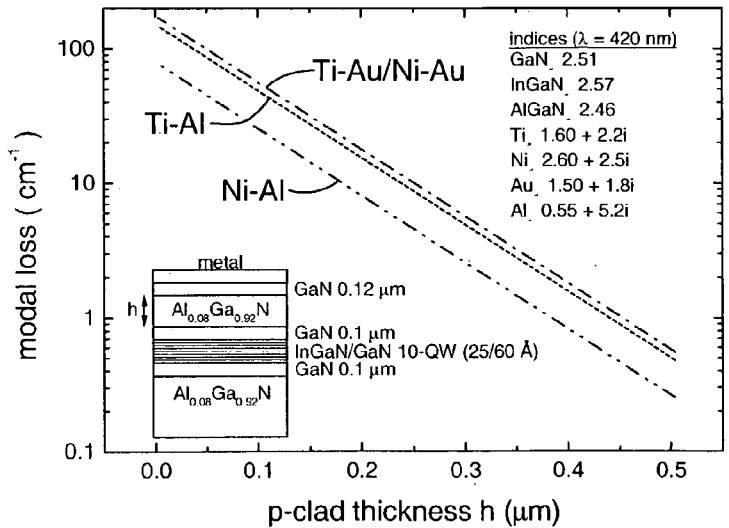

FIG. 2 is a graph showing variations in the optical confinement factor $\Gamma$ for a simplified 10-QW laser diode structure. In particular, FIG. 2 shows optical confinement factor variations with a GaN/air upper waveguide/cladding layer 170 as plotted versus the GaN layer thickness. According to an aspect of the present invention, when GaN-based upper waveguide/cladding layer 170 is produced with a thickness in the range of approximately 100 to 350 nm, a nitride-based laser diode structure is provided having an optical confinement factor $\Gamma$ that is substantially equal to or better than that of a comparable nitride-based laser diode structure using AlGaN cladding layer (as described above with reference to FIG. 7). Moreover, as can be seen in FIG. 2, the optical confinement factor $\Gamma$ for a nitride-based laser diode structure with GaN-based waveguide/cladding layer 170 is approximately 0.088 at the optimum GaN layer thickness of approximately 170 nm, which is clearly better than that achieved by conventional nitride-based laser diode structures using AlGaN cladding layers (as described above).

Referring again to FIG. 1, according to another aspect of the present invention, tunnel barrier layer 160 is a thin (i.e., in the range of 5 to 50 nm, e.g., approximately 20 nm) p-AlGaN layer (i.e., Al content of 10 to 30% mole fraction) that is formed between MQW region 150 and GaN:Mg upper waveguide/cladding layer 170. As set forth below, tunnel barrier layer 160 addresses a potential problem associated with omitting the conventional AlGaN:Mg cladding; i.e., leakage of electrons from MQW region 150.

Figure 3:
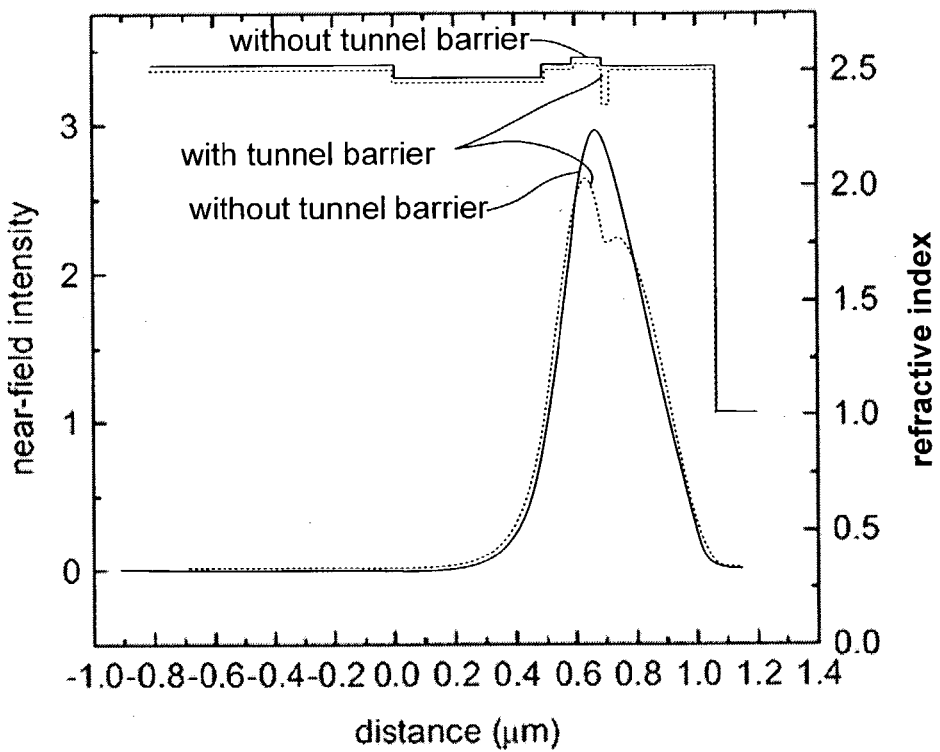
FIG. 3 is a graph illustrating refractive index profiles and near-field intensities for simplified laser diode structures formed with and without tunnel barrier layers.

FIG. 3 is a graph illustrating the refractive index profile and near-field intensity for simplified laser diode structures formed without tunnel barrier layer 160 (indicated by solid line) and with tunnel barrier layer 160 (indicated by dashed line). For purposes of illustration, a simplified laser diode structure similar to that introduced above is used (i.e., formed on a sapphire substrate, 4 nm of GaN, a 1000 nm AlGaN lower n-type cladding layer (x=0.07), a 100 nm GaN lower waveguide layer, and a 350 nm GaN upper waveguide/cladding layer that does not include a metal contact on top of the waveguide/cladding layer; the presence of a metal contact does not affect the results of the following comparison). Note that when tunnel barrier layer 160 is used, the laser diode structure includes a spacer layer 159 comprising GaN (i.e., in the range of 2 to 50 nm thick) between the last (uppermost) InGaN quantum well and the tunnel barrier layer. In addition, the simulations assume tunnel barrier layers including Al in the range of 10% to 30% (mole fraction) up to 20% Al, and a thickness in the range of 2 to 50 nm. These values indicate typical cases.

The present inventors determined that a thin AlGaN tunnel barrier layer 160 suppresses electron leakage from MQW region 150 without any significant decrease in optical confinement. As indicated in FIG. 3, the average confinement factor when tunnel barrier layer 160 is omitted is 0.97% per quantum well. When tunnel barrier layer 160 is incorporated, the average optical confinement factor per quantum well is 0.89%, indicative of a modest decrease in confinement. The electrical properties of both structures were then examined to determine the effect of incorporating tunnel barrier layer 160. Without tunnel barrier layer 160, the inventors found an applied voltage of 3.4 V results in a current of 9.7 kA/cm$^2$ (note that various loss mechanisms, which would increase the voltage and decrease the current, were not included in this simulation). However, there is a large electron leakage current, due to insufficient confinement of the electrons in the MQW region. In contrast, when a tunnel barrier layer 160 having 15% Al is used, the inventors found that, for the same total current as in the non-barrier embodiment, the electron leakage current was reduced to less than 0.5 kA/cm$^2$ (at the expense of having to apply a slightly larger voltage). If a thickness of 20 nm and composition of 20% Al is used for tunnel barrier layer 160, the electron leakage would be reduced even further, but at the expense of having to apply a larger voltage.

Absorption losses due to the presence of metal electrode 180 over waveguide/cladding layer 170 will now be discussed. Absorption loss of the transverse optical mode incurred by the p-electrode directly in contact with the p-GaN waveguide/cladding layer is shown in Table 1 (below). Calculations show that the absorption loss from the p-metal is expected to be on the order of 100 cm$^{-1}$ even for a GaN:Mg waveguide/cladding layer thickness of 0.7 nm (calculations were performed for a 3-QW sample with a 20 nm tunnel barrier layer and with a Ti/Au metal electrode 180).

TABLE 1

| Structure | $\Gamma$ | $\alpha$ |
|---|---|---|
| 500 nm AlGaN clad | 1.01% per QW | 1.6 cm$^{-1}$ |
| 700 nm GaN waveguide/cladding | 0.65% per QW | 125 cm$^{-1}$ |
| 350 nm GaN waveguide/cladding | 0.82% per QW | 138 cm$^{-1}$ |

Figure 4:
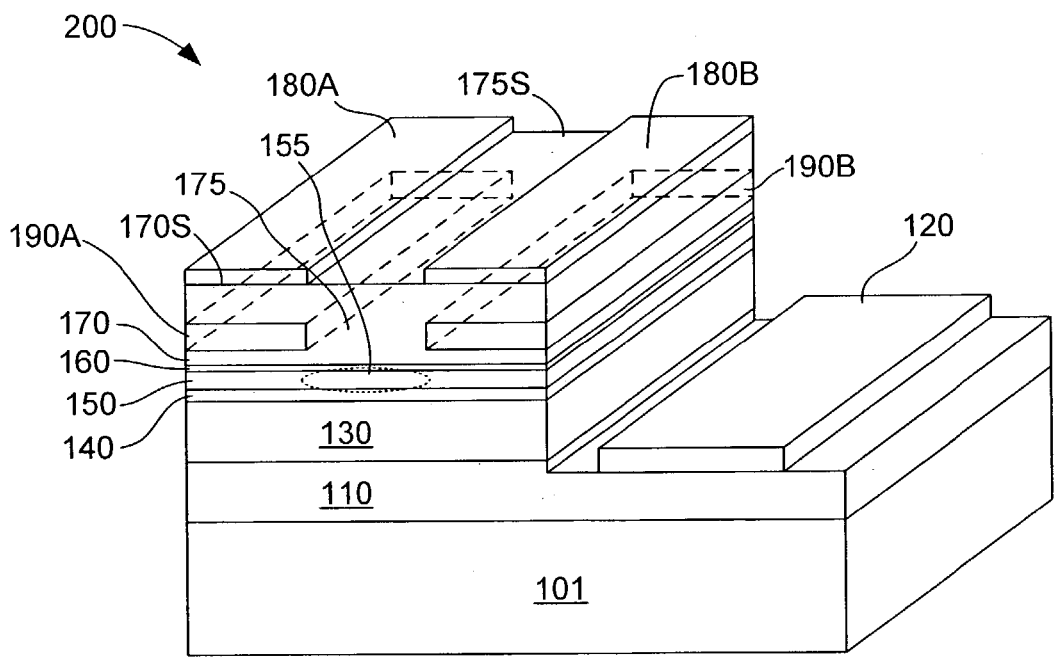
FIG. 4 is a perspective view showing a nitride-based laser diode structure according to another embodiment of the present invention.
Figure 5:
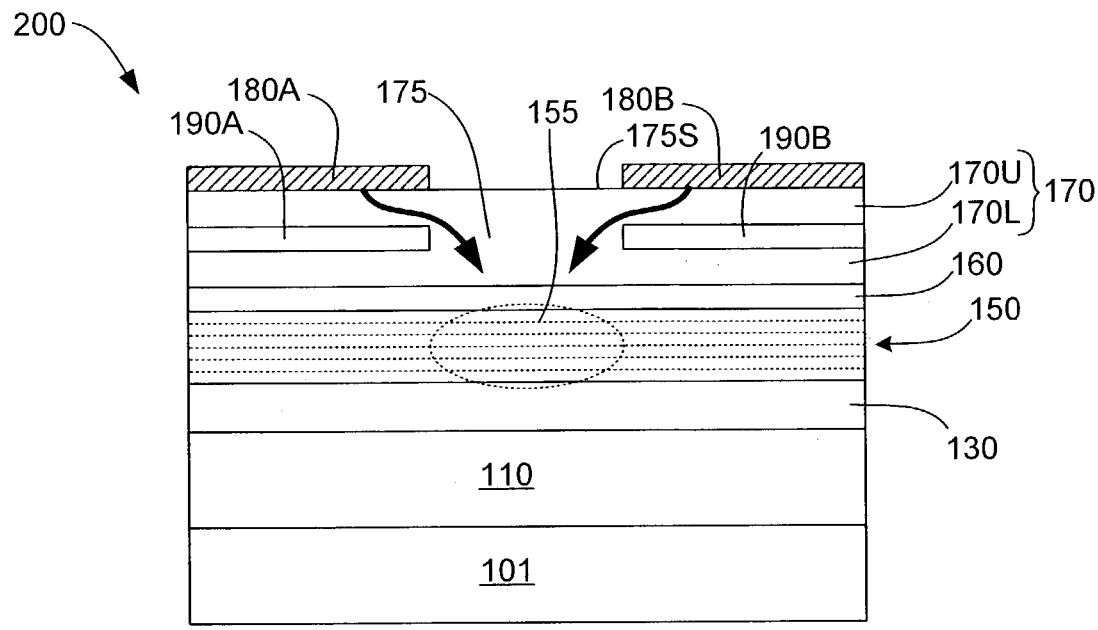
FIG. 5 is a front elevation view showing the nitride-based laser diode structure of FIG. 4.

FIGS. 4 and 5 are perspective and front elevation views showing a simplified nitride-based laser diode structure 200 according to a second embodiment of the present invention. Features of nitride-based laser diode structure 200 that are similar to structure 100 (described above) are identified with similar reference numbers.

According to another aspect of the present invention, in order to overcome the high absorption loss described above, the upper p-electrode (metal electrode) is in a split-gate arrangement including spaced apart first and second flat portions 180A and 180B that are formed on an upper surface 170S of waveguide/cladding layer 170. Note that a central section 175 of waveguide/cladding layer 170 is located between first portion 180A and second portion 180B such that an upper surface portion 175S over central section 175 is not contacted by any portion of the upper metal electrode. Note also that central section 175 is located over active region 155 of MQW region 150.

FIG. 5 includes dark arrows indicating the flow of holes from first and second flat portions 180A and 180B to active region 155. By utilizing the split-gate arrangement, the light guided between first and second flat portions 180A and 180B does not experience any absorption loss because surface portion 175S is free of any metal. In addition, the suggested structure also provides strong lateral mode discrimination, due to the strong absorption loss for lateral optical modes extending into the metalized region of the laser (i.e., outside of central region 175). Note that the width W of the spit-gate arrangement is in the range of 1 to 5 microns for single mode operation.

According to another aspect, as indicated in both FIG. 4 and FIG. 5, laser diode structure 200 further includes a current blocking structure 190 that is provided to achieve stable single mode operation at all pump currents. Current blocking structure 190 includes first and second spaced-apart portions 190A and 190B respectively located below first and second metal electrode portions 180A and 180B. That is, similar to metal electrode portions 180A and 180B, first and second current blocking portions 190A and 190B are separated by central section 175 of waveguide/cladding layer 170. Current blocking structure 190 is formed, for example, using AlGaN:Si, SiO$_2$, GaN:Si, AlN, Si$_3$N$_4$, or Si$_x$O$_y$N$_z$. In particular, when current blocking structure 190 is formed using AlGaN:Si, the resulting current blocking structure can be kept very thin, which makes it possible to incorporate more Al in current blocking layer portions 190A and 190B, which produces a larger bandgap and better blocking.

Figure 6:
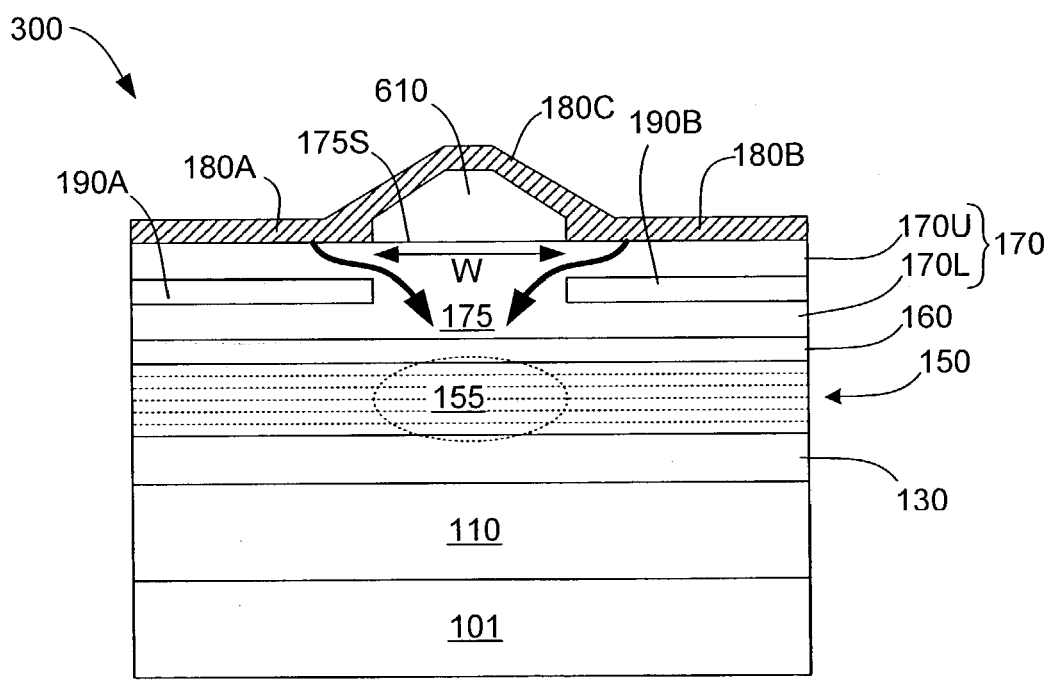
FIG. 6 is a front elevation view showing a nitride-based laser diode structure according to another embodiment of the present invention.

FIG. 6 is a front elevation view showing a simplified nitride-based laser diode structure 300 according to yet another embodiment of the present invention. Features of nitride-based laser diode structure 300 that are similar to the structures described above are identified with similar reference numbers.

According to the embodiment shown in FIG. 6, the upper metal electrode further includes a bridge portion 180C that is connected between first flat portion 180A and second flat portion 180B, and extends over central section 175 of waveguide/cladding layer 170. Bridge portion 180C serves to balance the potential applied to flat portions 180A and 180B. This structure forms a gap region 610 between upper surface portion 175S of central section 175 and a lower surface of bridge portion 180C. In alternative embodiments, gap 610 can be air-filled, or contain a suitable dielectric material (e.g., SiO$_2$, Si$_3$N$_4$, Si$_x$O$_y$N$_z$, and polyimid).

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A nitride-based laser diode structure comprising:
a quantum well region;
a waveguide/cladding layer formed on an upper surface of the quantum well region; and
a metal electrode formed on an upper surface of the waveguide/cladding layer,
wherein the waveguide/cladding layer consists essentially of p-doped Gallium-Nitride (GaN) and extends from the quantum well region to the metal electrode.

2. A nitride-based laser diode structure comprising:
a quantum well region;
a waveguide/cladding layer formed over the quantum well region; and
a metal electrode formed on an upper surface of the waveguide/cladding layer,
wherein the waveguide/cladding layer consists essentially of p-doped Gallium-Nitride (GaN),
wherein the quantum well region comprises alternating layers of Indium-Gallium-Nitride (InGaN) and GaN, and
wherein the waveguide/cladding layer has a thickness in the range of approximately 100 and 1000 nm, and comprises GaN doped with Magnesium.

3. The nitride-based laser diode structure according to claim 2, wherein the waveguide/cladding layer has a thickness of approximately 200 nm.

4. The nitride-based laser diode structure according to claim 3, further comprising a tunnel barrier layer formed between the quantum well region and the waveguide/cladding layer.

5. The nitride-based laser diode structure according to claim 4,
wherein the tunnel barrier layer comprises Aluminum-Gallium-Nitride doped with Magnesium (AlGaN:Mg),
wherein the amount of Aluminum in the tunnel barrier layer is in the range of 5 and 30% (mole fraction), and
wherein the tunnel barrier layer and has a thickness in the range of 5 to approximately 50 nm.

6. The nitride-based laser diode structure according to claim 5, wherein the quantum well region includes an upper GaN layer formed over an uppermost InGaN quantum well layer, wherein the tunnel barrier layer is formed on the upper GaN layer, and wherein the waveguide/cladding layer is formed on the tunnel barrier layer.

7. The nitride-based laser diode structure according to claim 4, wherein the metal electrode comprises a split-gate arrangement including first and second flat portions formed on the upper surface of the waveguide/cladding layer such that a central section of the waveguide/cladding layer located between the first and second portions has an upper surface portion that is not contacted by the metal electrode, wherein the central section is located over an active region of the quantum well region.

8. The nitride-based laser diode structure according to claim 7, wherein the metal electrode further comprises a bridge portion connected between the first and second flat portions and extending over the central section of the waveguide/cladding layer such that a gap region is formed between the upper surface portion of the central section and a lower surface of the bridge portion.

9. The nitride-based laser diode structure according to claim 8, wherein the gap region comprises a dielectric material.

10. The nitride-based laser diode structure according to claim 7, further comprising a current blocking structure located inside the waveguide/cladding layer, wherein the current blocking structure includes first and second portions respectively located below the first and second flat portions of the metal electrode, and wherein the first and second portions of the current blocking structure are separated by the central section of the waveguide/cladding layer.

11. The nitride-based laser diode structure according to claim 10, wherein the current blocking structure comprises at least one of Aluminum-Gallium-Nitride doped with Silicon (AlGaN:Si), Silicon-Dioxide (SiO2), Gallium-Nitride doped with Silicon (GaN:Si), AlN, Si$_3$N$_4$, and Si$_x$O$_y$N$_z$.

12. A nitride-based laser diode structure comprising:
a quantum well region;
a tunnel barrier layer formed on the quantum well region;

a waveguide/cladding layer formed on an upper surface of the tunnel barrier layer; and a metal electrode formed on an upper surface of the cladding layer, wherein the tunnel barrier layer comprises Aluminum-Gallium-Nitride doped with Magnesium (AlGaN:Mg), and wherein waveguide/cladding layer consists essentially of p-doped Gallium-Nitride (GaN).

13. The nitride-based laser diode structure according to claim 12, wherein the amount of Aluminum in the tunnel barrier layer is in the range of 10 to 30% (mole fraction).

14. The nitride-based laser diode structure according to claim 12, wherein the tunnel barrier layer and has a thickness in the range of 5 to approximately 50 nm.

15. The nitride-based laser diode structure according to claim 12, wherein the metal electrode comprises a split-gate arrangement including first and second flat portions formed on the upper surface of the waveguide/cladding layer such that a central section of the waveguide/cladding layer located between the first and second portions has an upper surface portion that is not contacted by the metal electrode, wherein the central section is located over an active region of the quantum well region.

16. The nitride-based laser diode structure according to claim 15, wherein the metal electrode further comprises a bridge portion connected between the first and second flat portions and extending over the central section of the waveguide/cladding layer such that a gap region is formed between the upper surface portion of the central section and a lower surface of the bridge portion.

17. The nitride-based laser diode structure according to claim 16, wherein the gap region comprises a dielectric material.

18. A nitride-based laser diode structure comprising:
a quantum well region;
a waveguide/cladding layer formed over the quantum well region;
a metal electrode formed on an upper surface of the waveguide/cladding layer; and
a current blocking structure located inside the waveguide/cladding layer, wherein waveguide/cladding layer consists essentially of p-doped Gallium-Nitride (GaN), and wherein the metal electrode comprises a split-gate arrangement including first and second flat portions formed on the upper surface of the waveguide/cladding layer such that a central section of the waveguide/cladding layer located between the first and second portions has an upper surface portion that is not contacted by the metal electrode, wherein the current blocking structure includes first and second portions respectively located below the first and second flat portions of the metal electrode, and wherein the central section of the waveguide/cladding layer is located over an active region of the quantum well region.

19. The nitride-based laser diode structure according to claim 18, wherein the metal electrode further comprises a bridge portion connected between the first and second flat portions and extending over the central section of the waveguide/cladding layer such that a gap region is formed between the upper surface portion of the central section and a lower surface of the bridge portion.

20. The nitride-based laser diode structure according to claim 18, wherein the first and second portions of the current blocking structure are separated by the central section of the waveguide/cladding layer.

21. The nitride-based laser diode structure according to claim 20, wherein the current blocking structure comprises at least one of Aluminum-Gallium-Nitride doped with Silicon (AlGaN:Si), Silicon-Dioxide (SiO2), and Gallium-Nitride doped with Silicon (GaN:Si), AlN, $Si_3N_4$, and $Si_xO_yN_z$.

* * * * *